(12) United States Patent
   Cheng

(10) Patent No.: US 10,632,534 B2
(45) Date of Patent: Apr. 28, 2020

(54) PROCESSES FOR PRODUCING AND TREATING THIN-FILMS COMPOSED OF NANOMATERIALS

(71) Applicant: Purdue Research Foundation, West Lafayette, IN (US)

(72) Inventor: Gary J. Cheng, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 328 days.

(21) Appl. No.: 15/053,754

(22) Filed: Feb. 25, 2016

(65) Prior Publication Data

US 2016/0250712 A1    Sep. 1, 2016

Related U.S. Application Data

(60) Provisional application No. 62/121,072, filed on Feb. 26, 2015, provisional application No. 62/121,083,
(Continued)

(51) Int. Cl.
   *B22F 3/105*        (2006.01)
   *H01L 31/0224*      (2006.01)
   (Continued)

(52) U.S. Cl.
   CPC .......... *B22F 3/105* (2013.01); *B22F 1/0025* (2013.01); *B22F 7/04* (2013.01); *B82Y 30/00* (2013.01); *C21D 10/005* (2013.01); *H01L 31/022491* (2013.01); *H01L 31/1884* (2013.01); *B22F 2007/042* (2013.01); *B22F 2999/00* (2013.01); *B82Y 20/00* (2013.01); *C21D 9/50* (2013.01);
   (Continued)

(58) Field of Classification Search
   CPC .......... B22F 1/0025; B22F 7/04; B22F 3/105; B82Y 30/00
   USPC ........................... 219/121.85, 121.6, 410, 58
   See application file for complete search history.

(56) References Cited

U.S. PATENT DOCUMENTS

5,656,186 A  *  8/1997  Mourou ................. A61B 18/20
                                              219/121.69
8,921,473 B1 *  12/2014  Hyman ..................... C08K 3/04
                                              423/445 R
(Continued)

*Primary Examiner* — Phuong T Nguyen
(74) *Attorney, Agent, or Firm* — Hartman Global IP Law; Gary M. Hartman; Domenica N. S. Harman

(57) ABSTRACT

Processes for producing and treating thin-films comprising nanomaterials are provided. A process of producing a transparent conducting film includes printing nanomaterials on a substrate, and directing a laser beam onto the nanomaterials to weld junctions between the nanomaterials. A process for tightly integrating nanomaterials with 2D material includes locating the 2D material over the nanomaterials, and directing a laser beam towards the 2D material to produce laser shock pressure sufficient to wrap the 2D material on the nanomaterials. A process of reducing the resistivity of a transparent conducting film includes directing a first laser beam towards a transparent conducting film having nanomaterials thereon such that the nanomaterials experience laser shock pressure sufficient to compress the nanomaterials, and then directing a second laser beam towards the transparent conducting film such that junctions between the nanomaterials are fused.

13 Claims, 12 Drawing Sheets

Related U.S. Application Data filed on Feb. 26, 2015, provisional application No. 62/133,552, filed on Mar. 16, 2015.

(51) Int. Cl.
*H01L 31/18* (2006.01)
*B22F 7/04* (2006.01)
*B82Y 30/00* (2011.01)
*C21D 10/00* (2006.01)
*B22F 1/00* (2006.01)
C21D 9/50 (2006.01)
B82Y 20/00 (2011.01)

(52) U.S. Cl.
CPC ......... *C21D 10/00* (2013.01); *C21D 2251/04* (2013.01); *Y02E 10/50* (2013.01)

(56) References Cited

U.S. PATENT DOCUMENTS

| | | | | |
|---|---|---|---|---|
| 2007/0039395 | A1* | 2/2007 | Gupta | C03C 17/34 73/800 |
| 2010/0065616 | A1* | 3/2010 | Zinn | B22F 1/0018 228/249 |
| 2012/0265122 | A1* | 10/2012 | El-Shall | A61K 41/0052 604/20 |
| 2013/0075377 | A1* | 3/2013 | Cheng | H01L 31/0392 219/121.85 |
| 2015/0048075 | A1* | 2/2015 | Pedrosa | B05D 3/0209 219/410 |
| 2015/0283287 | A1* | 10/2015 | Agarwal | A61F 13/02 424/444 |
| 2016/0089720 | A1* | 3/2016 | Kamakura | B29C 64/153 419/53 |

* cited by examiner

PROCESSES FOR PRODUCING AND TREATING THIN-FILMS COMPOSED OF NANOMATERIALS

CROSS REFERENCE TO RELATED APPLICATIONS

This application claims the benefit of U.S. Provisional Application Nos. 62/121,072, and 62/121,083, both filed Feb. 26, 2015, as well as U.S. Provisional Application No. 62/133,552, filed Mar. 16, 2015, the contents of all of which are incorporated herein by reference.

BACKGROUND OF THE INVENTION

The present invention generally relates to nanomaterials. The invention particularly relates to thin-films comprising nanomaterials and processes for producing and treating such films.

Nanomaterials are the subject of significant research across a broad spectrum of industries. As used herein, the term "nanomaterials" refers to zero-dimensional (0D) materials with all dimensions being nanoscale (as nonlimiting examples, quantum dots, nanoparticles, dendrimers, nanocapsules, Fullerenes, nanoclusters, and nanodispersions), one-dimensional (1D) materials with two dimensions being nanoscale and the third dimension being greater than nanoscale (as nonlimiting examples, nanofibers, nanotubes, nanowires and nanorods), two-dimensional (2D) materials with one dimension (thickness) being nanoscale and other dimensions being greater than nanoscale (as nonlimiting examples, graphene and boron nitride (BN) nanosheets, thin-films, and nanomembranes), and three-dimensional (3D) materials in which nanoscale features (i.e., 0D, 1D, and/or 2D materials) are present but with all dimensions greater than nanoscale. "Nanoscale" is defined herein as dimensions of up to 100 nanometers, e.g., 0.1-100 nm.

For devices that emit light (e.g., displays, LEDs, etc.), absorb light (e.g., photovoltaics, solar modules, photochemical devices, solar chemical factories, etc.), or control the transmission of light (e.g., smart windows), a non-transparent film (or a feature formed therefrom, for example, an electrode) blocks light and thus reduces the energy converted or light transmitted. Consequently, transparent conducting films (TCF) and components formed therefrom (for example, transparent conductive electrodes (TCEs)) that have desirable optical-electrical (or optoelectronic) properties are critical components in applications of the types noted above, and in particular have been widely used in flat panel displays, touch screen technologies, as well as thin-film solar cells and LEDs. Low-cost and large-scale manufactured TCFs and TCEs (hereinafter, collectively referred to as TCFs) have drawn increasing attention.

Currently, various types of material compounds, and particularly transparent conductive oxides (TCO) with outstanding optoelectronic properties have been used or considered for TCFs. Indium tin oxide (ITO) is widely viewed as a standard compound for most applications requiring optoelectronic properties. TCFs formed of ITO generally have a sheet resistance of as low as about 10 ohms/sq and a light transmission of up to about 90% in the visible spectrum. Zinc oxide (ZnO) thin-films have drawn much attention recently due to significant advantages over other TCO films, including ITO. Such advantages include chemical stability in reducing environments, and availability to doping with a wide range of materials. Among extrinsic n-type dopant elements, aluminum (Al) is the most widely used dopant in ZnO thin-films (aluminum-doped ZnO, or AZO). Unfortunately, TCO films have typically required high vacuum deposition, which is accompanied by issues such as instrumental complexity, high cost, and limited scalability.

Graphene, which is a 2D atomic crystal of carbon, has in a very brief span of time become instrumental in realizing goals in various disciplines of materials science. Applications in plasmonics, optoelectronics, transparent electrodes, LEDs, DNA sequencing, and protein chemistry are just a few examples. Future potential applications of graphene include wearable electronics, THz applications, IR lasers and many more. Parallel to the rise and establishment of graphene as an important material that could change existing technologies, several other 2D materials are joining the race, for example, boron nitride (BN), molybdenum sulfide, molybdenum selenide, tungsten sulfide, tungsten selenide, and many others.

At the core of practical applications of these 2D materials, their ability to be integrated onto a variety of nanomaterials of different dimensionalities (e.g., various "nanostructures") is very desirable. Wet transfer is a common technique used for transferring graphene or BN atomic sheets to surfaces of target nanomaterials, which includes spin-coating of a thin PMMA layer onto CVD-coated graphene on a copper foil, removing the copper foil by etching in an aqueous solution of iron chloride, using deionized water to transfer the PMMA-coated graphene to a target nanomaterial, and finally removing the PMMA coating. Wet transfer of graphene typically results in wrinkles, air-gaps and voids that can give rise to compromised physical contact between the graphene (or other 2D material) and target nanomaterials. Such lack of physical contact of graphene with functional nanomaterials degrades the out-of-plane electronic transport and chemical interactions therebetween, and thus hampers several possible opportunities and frontline applications of hybrid integrated nanosystems composed of functional nanomaterials and graphene or other 2D materials. For example, the interface between functional nanomaterials and graphene is very crucial for various nanomaterial systems, such as plasmonic materials, ferroelectric materials, magnetic materials, DNAs, proteins, cells as well as other bio-organisms and other functional nanomaterials.

There is an ongoing desire to incorporate nanomaterials-based thin-films into a variety of applications, including TCFs.

BRIEF DESCRIPTION OF THE INVENTION

The present invention provides processes of producing and treating thin-films composed of nanomaterials, nonlimiting examples of which include producing transparent conducting films, reducing the resistivity of transparent conducting films, and integrating nanomaterials with 2D materials.

According to one aspect of the invention, a process of producing a transparent conducting film includes printing nanomaterials on a substrate, and directing a laser beam onto the nanomaterials to weld junctions between the nanomaterials.

According to another aspect of the invention, a process for tightly integrating nanomaterials with a 2D material includes locating the 2D material over the nanomaterials and directing a laser beam towards the 2D material such that the 2D material experiences laser shock pressure sufficient to wrap the 2D material on the nanomaterials.

According to another aspect of the invention, a process of reducing the resistivity of a transparent conducting film includes providing the transparent conducting film having nanomaterials located thereon, directing a first laser beam towards the transparent conducting film such that the nanomaterials experience laser shock pressure sufficient to compress the nanomaterials, and then directing a second laser beam towards the transparent conducting film such that junctions between the nanomaterials are fused.

Technical effects of the processes described above preferably include the ability to manufacture thin-films comprising nanomaterials and incorporate the resulting nanomaterials-based thin-films into a variety of applications.

Other aspects and advantages of this invention will be better appreciated from the following detailed description.

DETAILED DESCRIPTION OF THE INVENTION

The present invention provides processes for producing and/or treating thin-films comprising nanomaterials, in particular by integrating 0D, 1D, 2D, and/or 3D nanomaterials together using laser or other high speed intensive optical source processing systems, particularly to join the nanomaterials by pulsed laser induced welding, or by laser shock induced integration.

In a first nonlimiting embodiment, a process is provided for joining or welding of conductive nanomaterials, particularly 1D metallic materials including nanowires, for example, to produce transparent conducting films (TCFs) formed entirely of the conductive nanomaterials.

Figure 1:
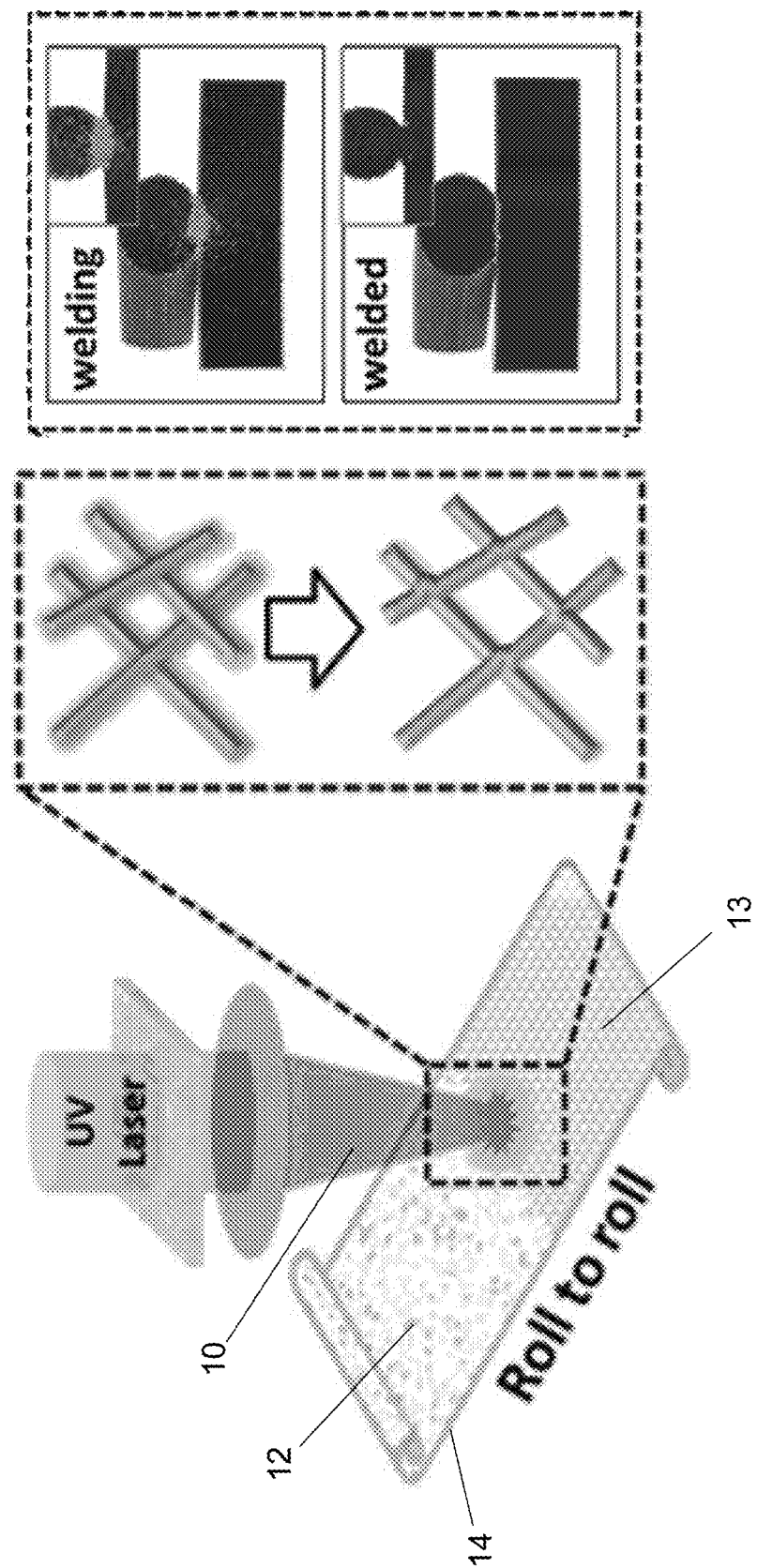
FIG. 1 schematically represents a roll-to-roll printing and laser welding process in accordance with certain aspects of a first embodiment of the invention.

Such a process includes laser heating one or more layers of conductive nanomaterials, for example nanowires, that have been printed on a substrate as a thin-film. Preferably, such a technique involves direct laser welding of a printed conductive nanowire network that has been applied by a roll-to-roll printing process to a flexible substrate, for example, a polymer substrate. FIG. 1 represents such a process as generally comprising directing a laser beam 10 (or a beam from another high speed intensive optical source) at a nanowire network 12 on a substrate 14 as the substrate 14 is conveyed under and past the beam 10. As a more particular example, a nanowire network 12 comprising one or more layers of silver nanowires can be printed on a polyethylene terephthalate (PET) substrate 14 by a roll-to-roll system with a reverse kiss gravure coater. The resulting printed nanowire network 12 is then rapidly scanned by the beam 10 in such a manner that a welded nanowire network 13 is formed comprising welded nanowire junctions that join adjacent nanowires of the network 12 at points of contact between the nanowires. The welded nanowire network 13 may be suitable for use as a transparent conducting film (TCF) having a desirable morphological, structural, and electrical configuration that would otherwise be difficult or impossible to form using a near-equilibrium long duration heating method, such as heating in an oven, furnace, or other convective heating apparatus. The high speed intensive optical scan forms the welded nanowire junctions in optical exposure times of microseconds (i.e., less than a millisecond), resulting in ultra-fast localized heating of the printed nanowire network 12 to form the welded nanowire junctions without otherwise affecting the nanowires themselves and preferably without damaging or melting of the underlying substrate 14.

For silver nanowire (Ag NW) networks that exhibit high transmittance, conduction is typically dominated by percolation through the nanowire-nanowire junctions, which have relatively large junction resistances (MΩ). Results obtained with investigations leading to the invention evidenced that direct welding with pulse laser scanning to achieve exposures lasting only several microseconds can produce welded silver nanowire TCFs on a commercially scalable level using roll-to-roll printing. The printing process can utilize a Meyer rod coating technique to deposit a high aspect ratio silver nanowire network on a flexible substrate at printing line speeds of as high as at least 1.5 m/min yet achieve outstanding film quality. Pulsed laser scanning can then generate localized heat in the spaced Ag NW junctions to weld the nanowires together and decrease the overall sheet resistance of the TCF. In particular, the pulsed laser irradiation generates heat at nanowire junctions due to an electromagnetic field concentration that occurs in a nanoscale gap between two crossed nanowires. As a consequence, thermally-activated isolated silver atoms flow over nanowire junctions and recrystallize at solder points.

Figure 2:
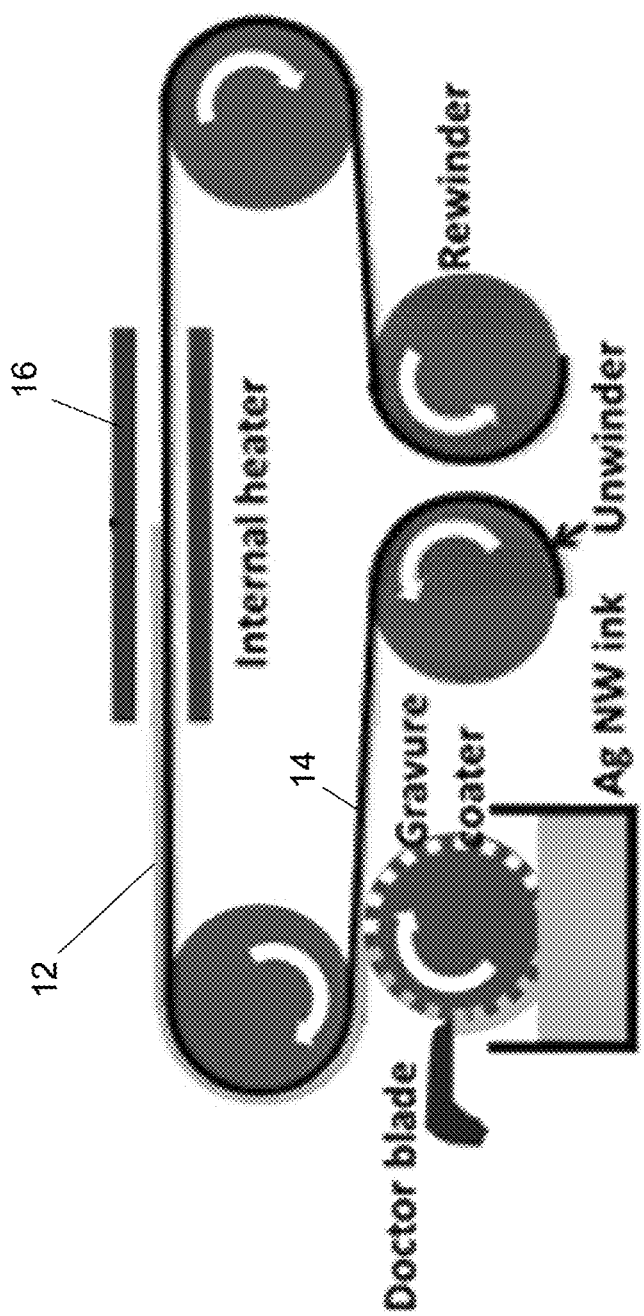
FIG. 2 schematically represents a roll-to-roll printing system suitable for use in producing a film comprising a nanomaterial on a flexible substrate.
Figure 3:
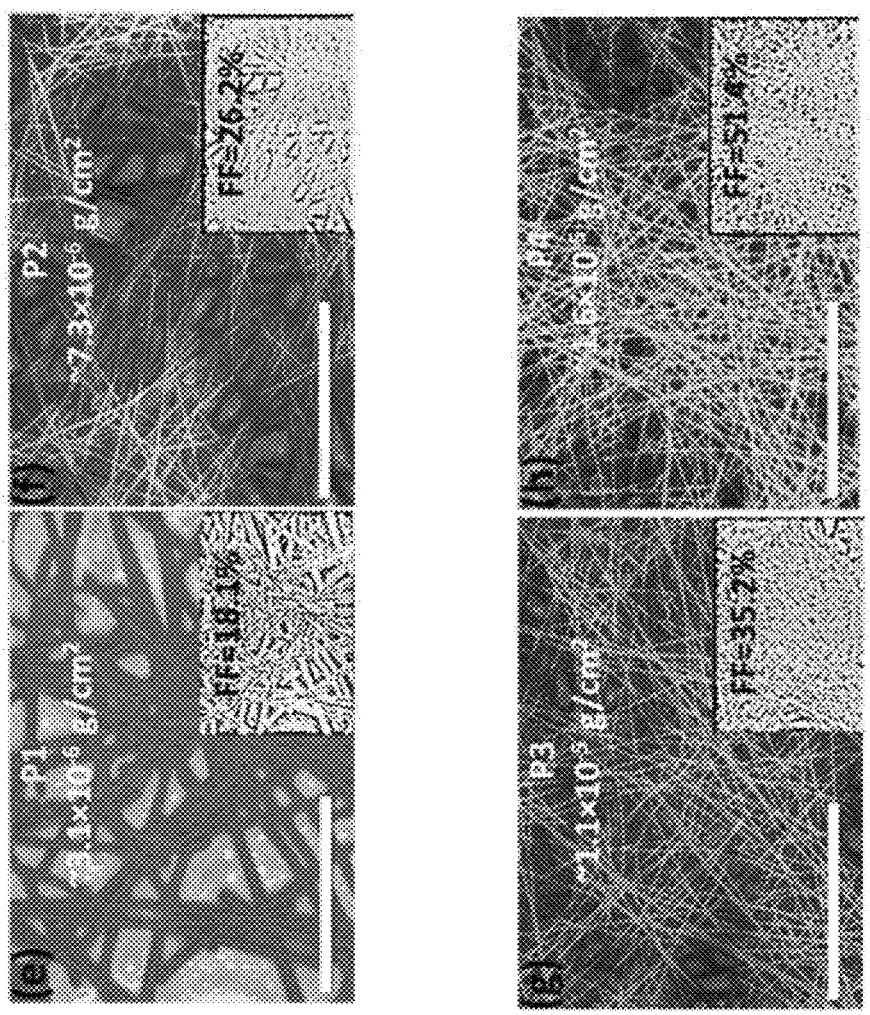
FIG. 3 contains scanning electron microscope (SEM) images of nanowire film printings comprising varying nanowire concentrations produced with a system of the type represented in FIG. 2.

During the above noted investigations, a silver nanowire aqueous solution (ink) with nanowire diameters of about 35 nm and lengths of 15 to 30 μm were dispersed in ethanol at a concentration of 2.5 mg mL$^{-1}$ or 10 mg mL$^{-1}$. As schematically represented in FIG. 2, an Ag NW network 12 was roll-to-roll printed onto a continuous flexible PET web 14, where parameters of the roll-to-roll system including PET web tension, micro roll speed, and line speed were controlled for better printing quality. The line speed used was 1.5 m min$^{-1}$ for efficient printing. Higher line speeds resulted in sparser nanowire area density, but may be densified by higher micro roll speed. Immediately after printing, the as-coated film was translated to an internal heater 16 for further drying at about 110° C., with a translating speed of about 1.5 m/min with an automatic scroll system. FIG. 3 shows scanning electron microscope (SEM) images of the printings comprising varying nanowire concentrations (densities). It was found that the ink concentration played a role in tuning the ink viscosity optimally for uniform coatings, which performed best at concentrations of about 1 to 2.5 mg/mL. To boost efficient manufacturing for commercial scale-up, 2.5 mg/mL concentration was applied. Ag NW films with different area densities on PET substrates could be printed by manipulating ink concentration, wet thickness and coating area.

After printing the Ag NW network, a KrF excimer laser ($\lambda$ of 248 nm and τ of 25 ns) with a repetition rate (RR) of 10 Hz was directed to the network to improve the cross-wire junctions. To efficiently process a large-scale film, the laser beam was shaped to a square, top-hat profile (8×8 mm) and enabled translations along both X and Y-axes. Laser intensity utilized in the welding was 20 mJ cm$^{-2}$, and the exposure time of each spot ranged from 0.25 to 3.75 μs corresponding to 10 to 150 pulses. The laser intensity was chosen to achieve a nearly negligible heating effect on the PET substrate.

Figure 4:
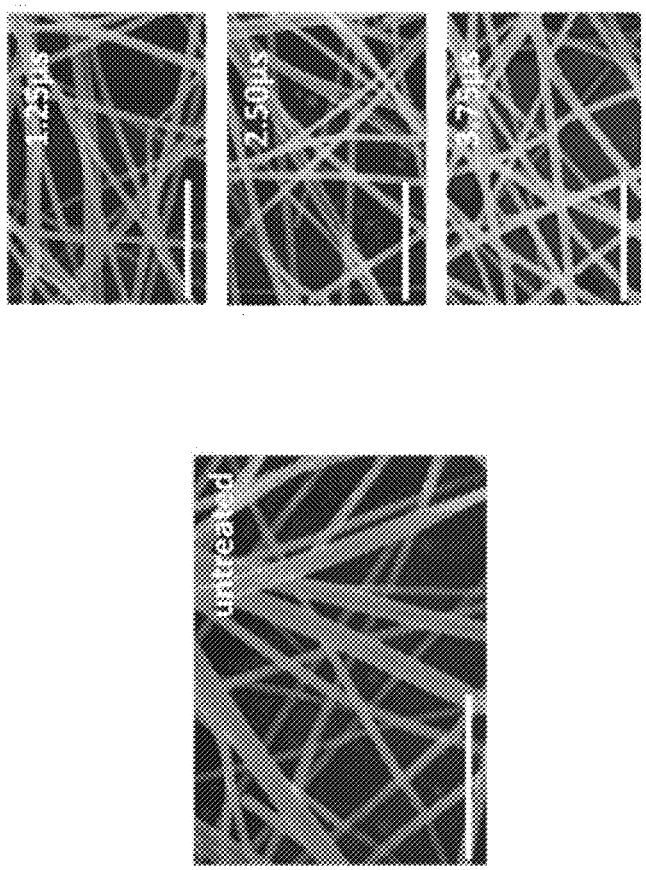
FIG. 4 contains plane-view SEM images collected before performing a laser welding process of the type represented in FIG. 1, and after different laser exposure times.
Figure 5:
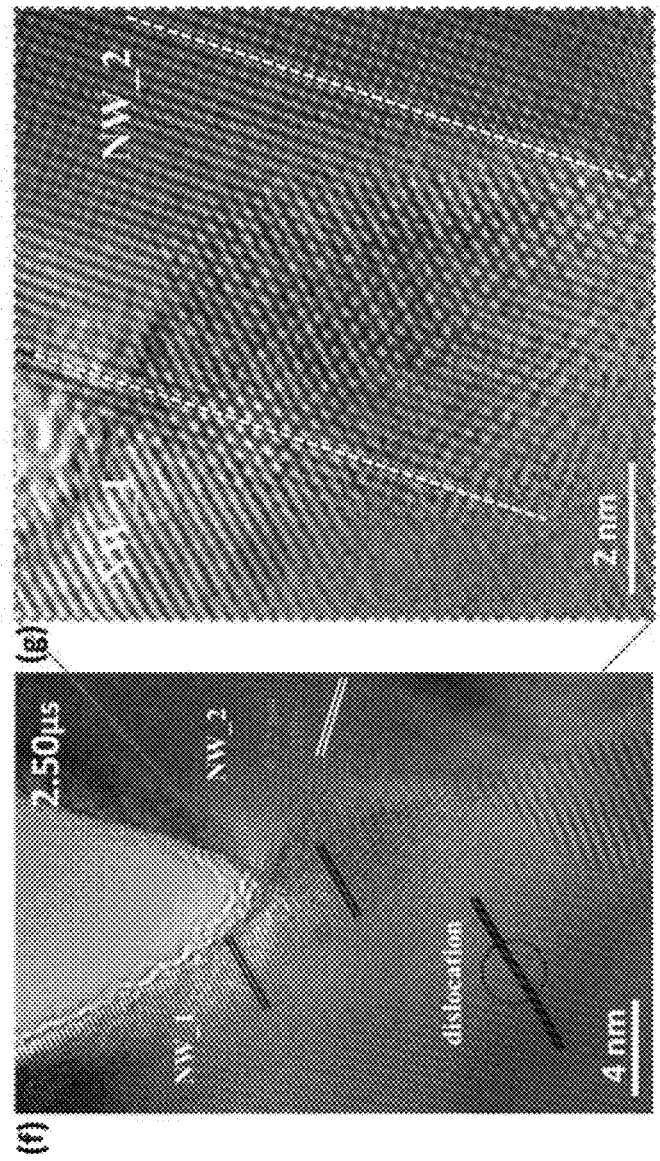
FIG. 5 contains high resolution transmission electron microscope (TEM) images showing solder point formation of samples produced by the process of FIG. 1.

FIG. 4 shows plane view SEM images collected before laser welding and after different laser exposure times. The lefthand image of FIG. 4 shows clearly distinct individual nanowires before welding. The top and middle righthand images of FIG. 4 show partial welds formed at NW-NW junctions that were subjected to 1.25 and 2.50 μs laser exposures. The partial welds are indicated by contrast change at solder point formations. The lower righthand image of FIG. 4 shows NW-NW junctions that were completely welded together as a result of being subjected to a 3.75 μs laser exposure. Further evidence of complete welds at the solder point formations was also provided by high resolution TEM images shown in FIG. 5. As marked by NW_1 and NW_2, two nanowires slant downward and merge together. The resulting thin-films had properties including low sheet resistances (Rs) of about 5 Ω/sq and 91% transmittance (T) at a wavelength ($\lambda$)=550 nm; and Rs of about 13 Ω/sq and 95% T at $\lambda$=550 nm.

The rapid laser welding of nanowires is a non-contact optical method and utilizes intensive radiation pulses to melt the nanowire junctions, in which various NW-NW junctions may be mostly or completely melted while the nanowires are themselves only slightly melted or not melted at all. Rapid laser welding techniques preferred for joining the silver nanowires are different from other optical methods such as UV lamp welding, in part because the electromagnetic wave power density is much higher and the required exposure time is much lower, which enhances the manufacturing efficiency for commercial applications.

A technical feature of processes of the type described above is the capability of producing a TCF that can exhibit high optoelectronic performance and may consist entirely of conductive nanowires, yielding a relatively inexpensive, flexible, stable and scalable alternative for known TCFs. Such TCFs can improve the manufacturing of electronic devices that require clear conductive layers, for example, touchscreens. The TCF's can also be useful for the mobile phone industry, personal computer industry, and any other industry that utilizes touchscreen technology or would benefit from or utilize a TCF and a component formed therefrom.

A second nonlimiting embodiment relating to processes of laser joining or welding nanomaterials particularly involves laser joining or welding 1D and 0D nanomaterials to produce, for example, TCFs, nonlimiting examples of which comprise a metal oxide and silver and/or copper nanowires.

Such a process includes laser heating a composite material that comprises conductive nanomaterials, particularly nanowires, for example, silver and/or copper nanowires, embedded in a transparent conductive oxide (TCO) nanoparticle (NP) matrix. For example, the TCO material may comprise an aluminum-doped zinc oxide (AZO) NP matrix material, which can be roll-printed as a thin-film on a flexible substrate, for example, a polymer substrate similar to the process represented in FIG. 1. The applied NP matrix material can then be subjected to a laser beam, preferably high-speed pulsed laser annealing (PLA) to make use of the selectivity of pulsed laser heating to form a high quality TCF on the substrate without damaging or melting of the substrate. In investigations leading to the invention, composite materials comprising AZO NP matrices were printed and annealed to yield TCFs having large crystals on polymer and steel substrates.

A technical feature of the invention is that processes of the type described above are capable of producing a composite TCF that combines a TCO matrix material and conductive nanowires, which in combination yields a nanocomposite TCF that, in some cases, is capable of outperforming current TCO technologies in terms of properties and/or cost. As an example, a composite TCF formed by a laser-processed Ag NW in an AZO NP matrix may theoretically outperform known TCFs produced by existing printable manufacturing technologies in terms of both sheet resistance and transparency. Additional technical features of the invention can include the ability to use abundant materials to produce the composite TCF, for example, silver and/or copper as the nanowire material and AZO NPs as a material for the host matrix. The amount of nanowires in the composite TCF can be at levels that will have a minimal impact on cost and availability of the composite TCF. Another technical feature is that a large line laser can be used to heat the composite material without overheating the underlying substrate, allowing for the use of relatively low-cost substrates, including flexible polymer substrates that allow for relatively low-cost roll to roll printable manufacturing. The composite TCFs can also exhibit robust reliability and lifetime, for example, the integration of Ag NWs in an AZO matrix can offer greater stability than if the TCF was formed solely of Ag Nws.

In a third nonlimiting embodiment, a process is provided for tightly integrating target nanomaterials with 2D materials, including but not limited to graphene, with a laser shock induced wrapping or laser shock integration process that can be performed at or near room temperatures.

The process employs laser shock pressure to tightly integrate graphene and/or other 2D materials with targeted nanomaterials of various dimensionalities (e.g., 0D, 1D, 2D and 3D). The process can be carried out at room temperature, and laser pressure can be applied for as little as a few nanoseconds. Due to extreme laser shock pressures, a 2D material, while overlying a targeted nanomaterial, can become tightly integrated with the targeted nanomaterial.

When used to integrate graphene on a nanomaterial, the laser shock integration technique is able to improve interfaces between the graphene and nanomaterial, which can be of extreme importance for electronic, optoelectronic and photonic applications and other applications including label-free biological or chemical sensing. The laser shock integration technique is scalable and can be employed for essentially any target nanomaterial, whether metallic, semiconducting, polymeric, or bio-organism, and whether rigid or pliant. For example, investigations leading to the invention have shown the laser shock integration technique to tightly integrate 2D materials such as graphene and boron nitride (BN) with a variety of nanomaterials, including but not limited to quantum dots (0D), metallic nanowires and nanorods (1D), metallic thin-films (2D), and three-dimensional (3D) silicon molds and metallic grids. When performed at or near room temperature, the laser shock integration technique is also compatible with biological cells, DNAs, proteins and other bio-organisms, and does not appear to alter their original chemical or biological activity. Because the laser intensity determines the final laser shock pressure, controlled application of a desired pressure, for example, several GPa, is possible. Other laser parameters, including power, laser beam area, and laser wavelength, can be varied to suit to the needs of a particular application, and thus a unique set of laser parameters can be employed to accurately achieve laser shock pressure levels needed to integrate 2D materials with nanomaterials of particular interest.

Figure 6:
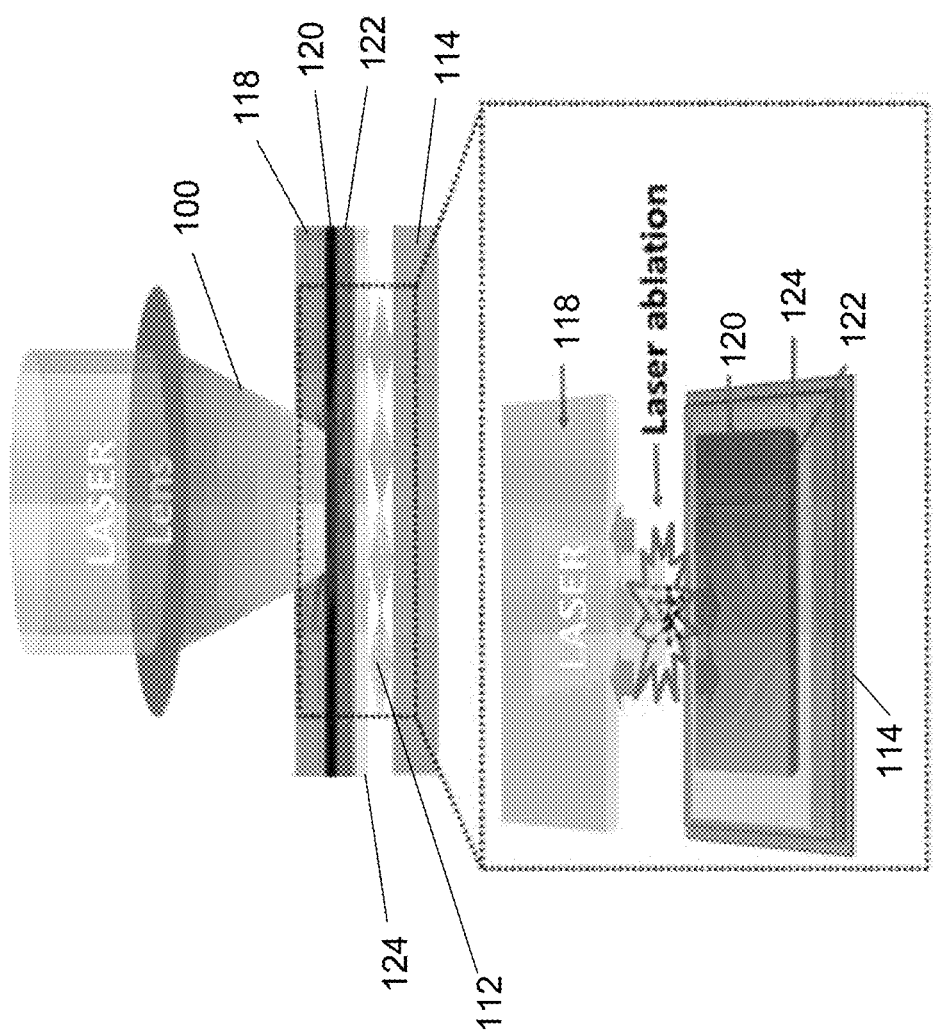
FIG. 6 schematically represents a process for tightly integrating target nanomaterials with 2D materials (for example, graphene). The nanomaterials and 2D materials are located on a substrate and covered with an aluminum layer, black-body absorbing layer, and a glass confinement layer. During the process, a laser beam is directed through the glass confinement layer to the black-body absorbing layer.
Figure 7:
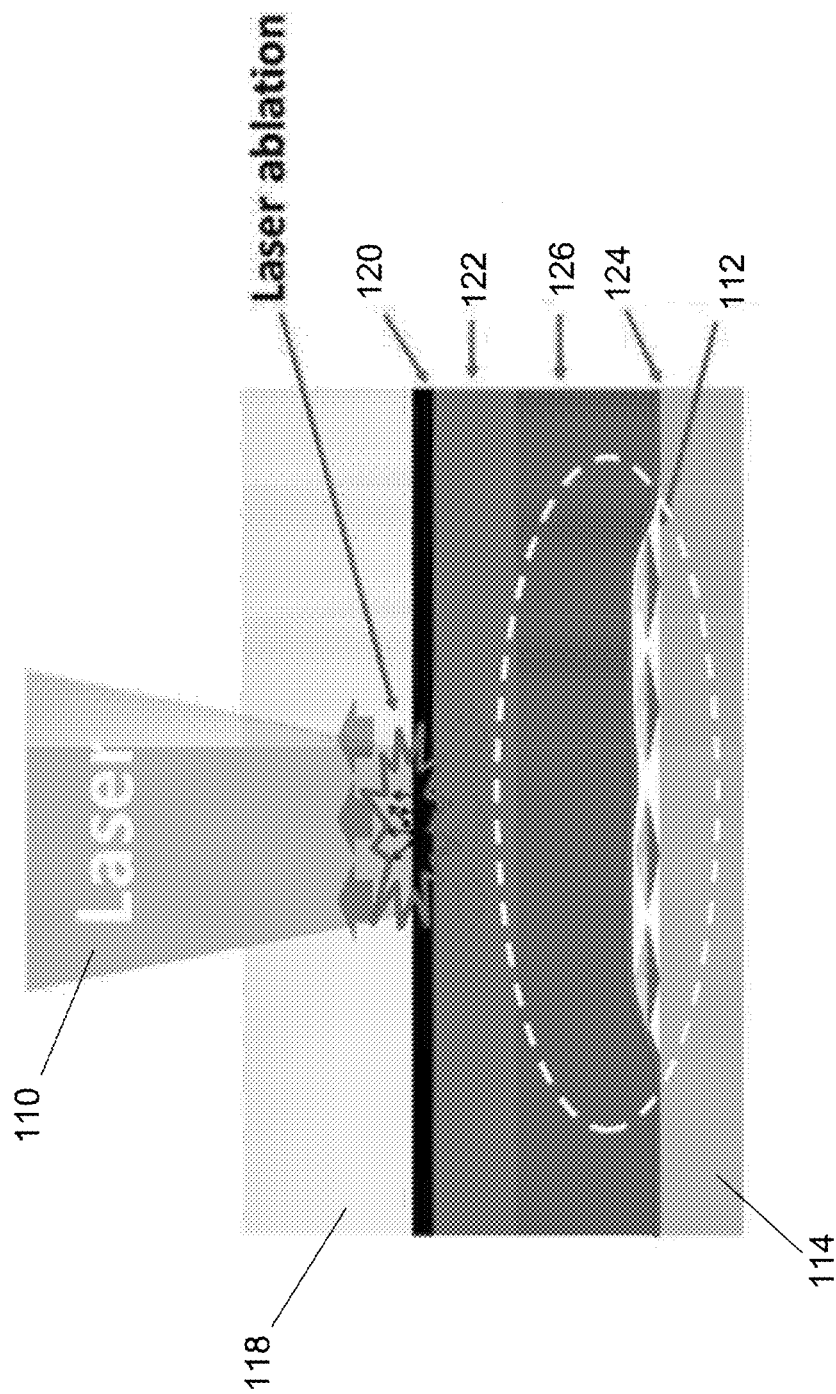
FIG. 7 schematically represents a process similar to FIG. 6, but further including a layer of water between the glass confinement layer and the nanomaterials and 2D materials.
Figure 8:
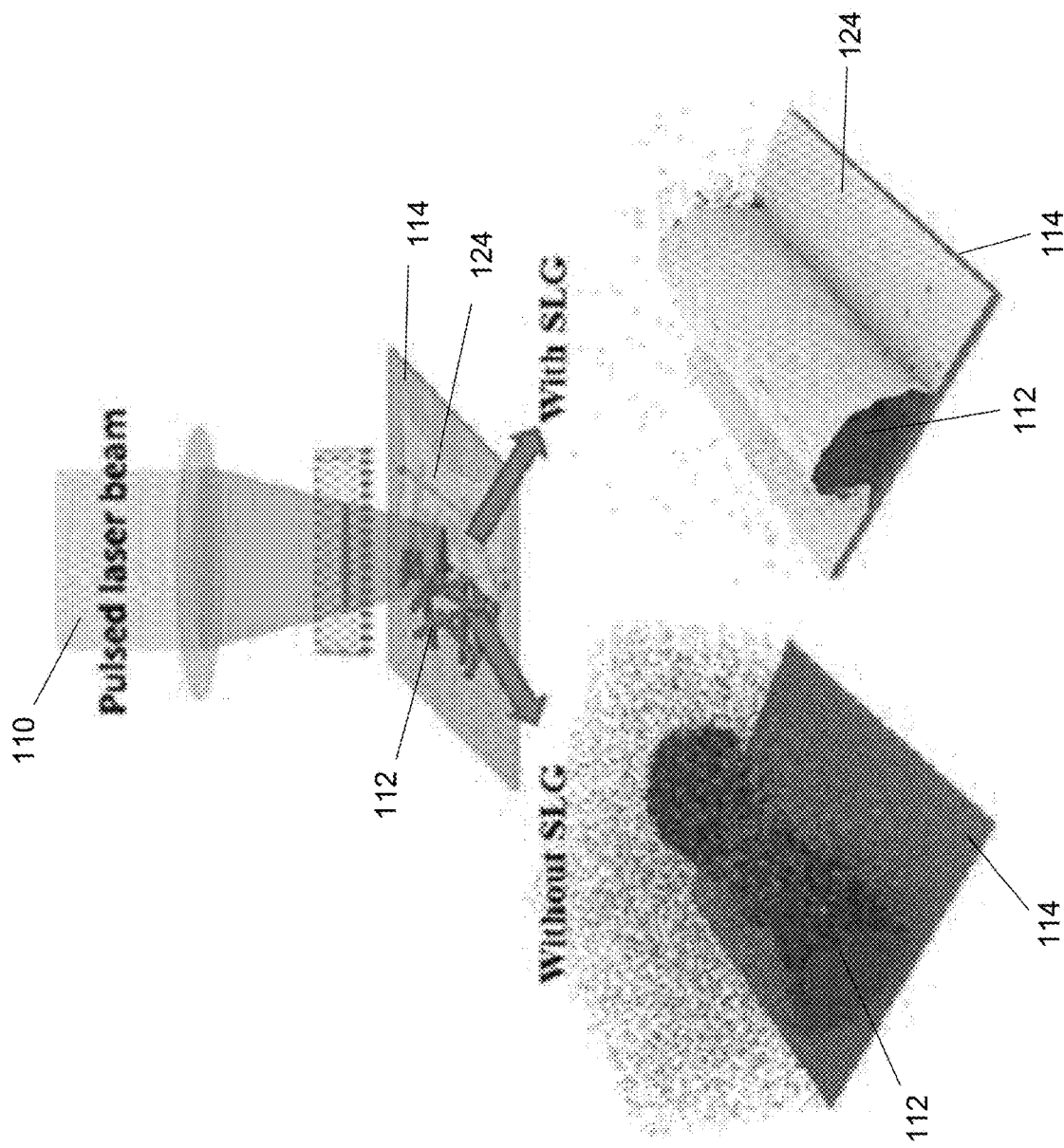
FIG. 8 schematically represents a process for tightly integrating target nanomaterials with 2D materials (for example, graphene), wherein a 2D material is located over nanomaterials and then directly irradiated with a laser beam.
Figure 9:
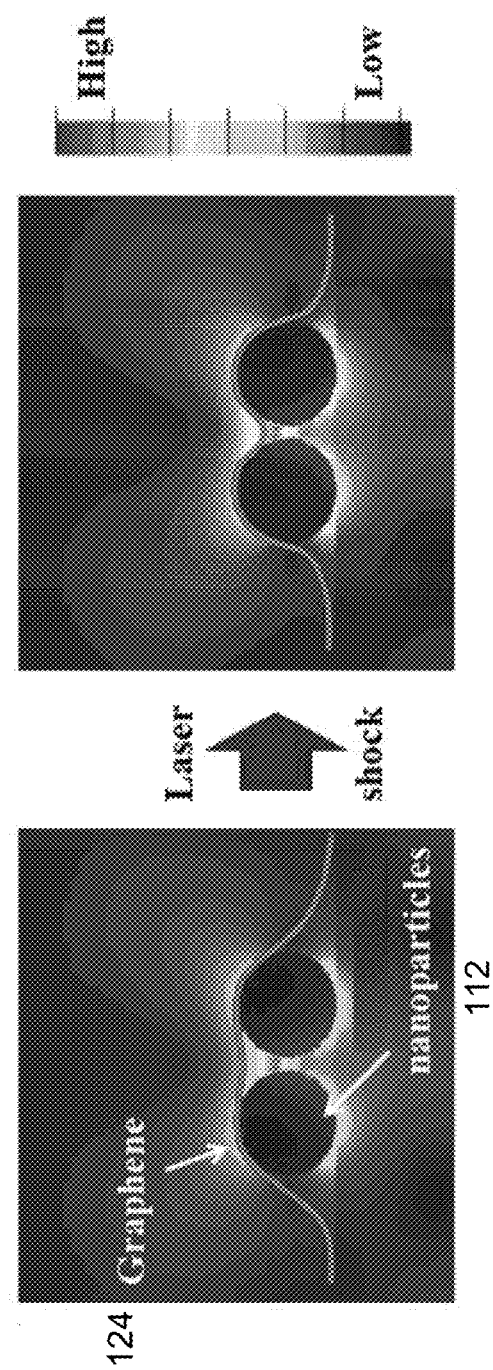
FIG. 9 represents a graphene layer overlaying nanoparticles prior to laser shocking (left), for example, with one of the processes of FIGS. 6 through 8, and wrapping the nanoparticles with the graphene layer after laser shocking (right).

FIG. 6 schematically represents a laser shock integration process comprising a laser beam 100 that is directed through a glass confinement layer 118 to irradiate a black-body absorbing layer 120, for example graphite. Beneath the absorbing layer 120 is an aluminum layer 122, which in turn overlies a graphene layer 124 and a targeted nanomaterial 112, all of which is supported on a substrate 114. As indicated in the expanded window of FIG. 6, the absorbing layer 120 may be ablated while heat is conducted away from the graphene 124 and targeted nanomaterials 112 by the aluminum layer 122 so that substantially only laser shock pressure is transferred to the graphene 124 layer and nanomaterials 112, resulting in tight integration thereof. FIG. 7 schematically represents the process of FIG. 6 as further comprising a layer of water 126 between the graphene layer 124 and the aluminum layer 122. The additional layer of water 126 transfers the generated shock pressure to conformally wrap the graphene layer 124 on the nanomaterials 112. The technique utilizes the shock pressure generated by laser ablation and water impermeability of graphene to effectively flatten graphene wrinkles on or around 3D surfaces (e.g., wrap the surfaces). FIG. 8 schematically represents a laser shock integration process wherein a graphene layer 124 is located over nanoparticles 112 and then directly irradiated with a laser beam 110, without additional intermediate glass, absorbing, aluminum, water, etc. layers. FIG. 8 also represents the effect of directing the laser beam 110 to the nanomaterials 112 with (righthand side of FIG. 8) and without (lefthand side of FIG. 8) the graphene layer 124 over the nanoparticles 112. FIG. 9 represents the graphene layer 124 as overlaying nanomaterials (nanoparticles) 112 prior to laser shocking (lefthand side of FIG. 9), and wrapping the nanoparticles 112 after laser shocking (righthand side of FIG. 9).

The ability to use laser shock pressure to integrate 2D materials onto essentially any nanomaterial is of significance in light of the emergence of applications for graphene-based hybrid nanosystems, nonlimiting examples of which include solar cells, LEDs, graphene-based spintronic devices, light trapping, photonic devices, ultra-sensitive chemical devices, biological sensors etc. As particular examples, gold pyramids can be integrated with graphene to yield extremely sensitive label-free chemical sensors and bio-sensors. Similarly, graphene can be integrated onto germanium nanowires to yield faster electronics. Stacked structures of 2D materials can be fabricated to produce functional electronic, photonic, and optoelectronic devices based on 3D stacks of 2D materials.

In investigations leading to the present invention, laser shock integration was demonstrated with 2D sheets of graphene and BN and various target nanomaterials, such as quantum dots (0D), silver nanowires (1D), gold nanorods (1D), gold bipyramids, gold thin-films (2D), silicon trench molds and nanogrids (3D) and gold nanomaterials (3D). In a particular investigation, single layers of CVD-synthesized graphene or BN (2D atomic crystals) were wet-transferred to target nanomaterials. A graphite-coated aluminum foil below a glass confinement layer was then irradiated with a Nd-YAG laser (532 nm wavelength). The graphite powder was ablated while heat was sufficiently conducted away from the graphene and targeted nanomaterials so that substantially only laser shock pressure was transferred to the graphene and nanomaterials, resulting in tight integration of the graphene with the nanomaterials. The laser shock pressure effectively flattened the graphene layer and removed air gaps and voids at the interface between the graphene and nanomaterials, thus enhancing physical contact therebetween.

Figure 10:
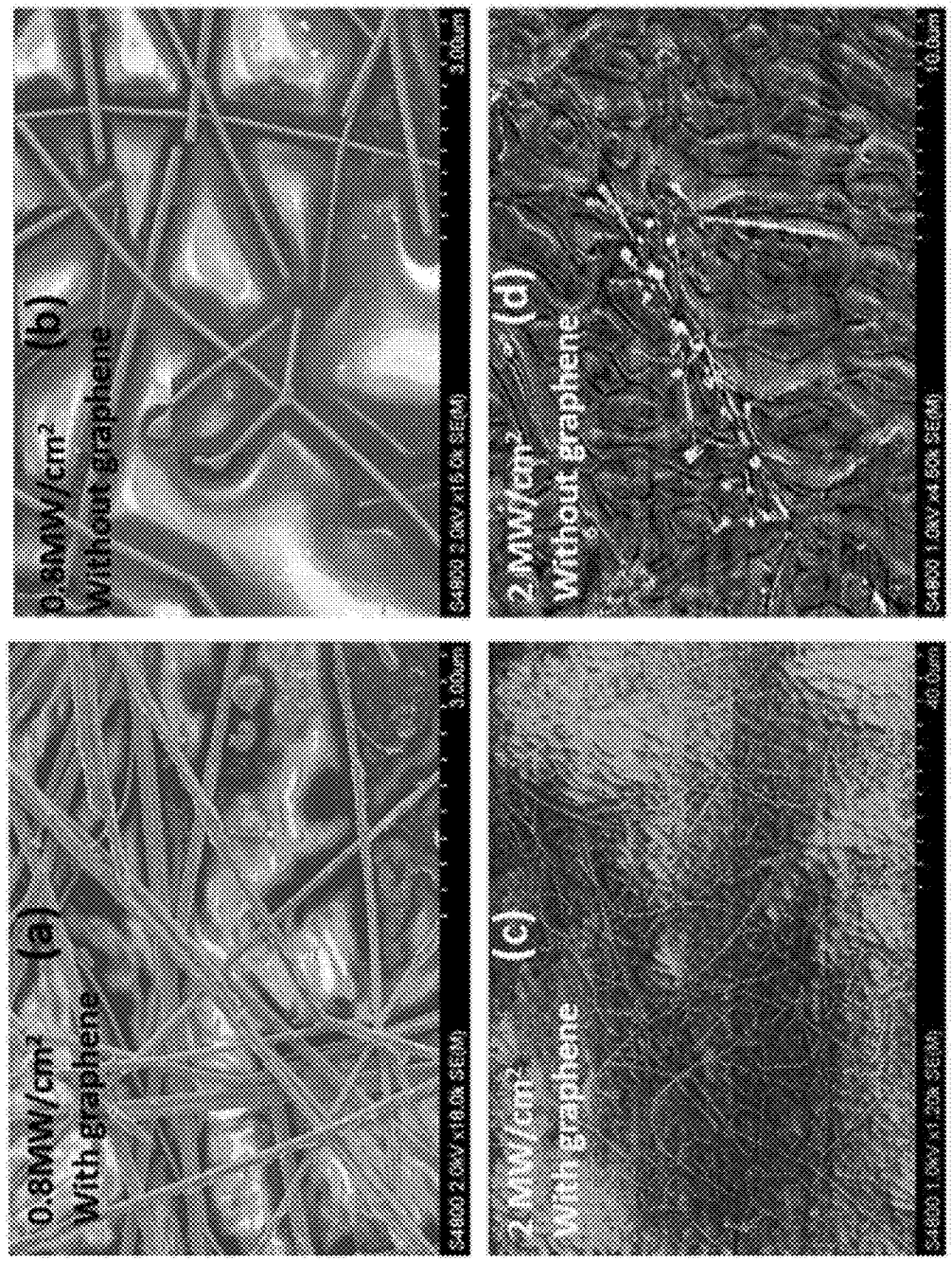
FIG. 10 contains images representative of an effect of a graphene barrier on a silver nanowire network fabricated on a flexible PET substrate after laser irradiation.

The low-temperature capability of the laser shock integration techniques discussed above also offer important benefits. In addition to avoiding the degradation of a 2D material and the nanomaterial with which it is integrated, the technique can be used with metallic nanomaterials that tend to oxidize at high temperature processing conditions and lose their functionality, for example, plasmonic behavior that is pivotal to particular applications including SERS-based label-free chemical and bio-sensing. The technique can also be used with nanoparticles or nanodots, which undergo grain growth at high processing temperatures, and with fine nanofeatures that tend to deform even at relatively low temperatures. FIG. 10 represents the effect of a graphene barrier on a silver nanowire network fabricated on a flexible PET substrate. In images (a) and (b), SEM micrographs show results for a hybrid network and an NW network, respectively, after laser irradiation with a power density of 0.8 MW/cm$^2$. Images (c) and (d) show the hybrid and NW networks, respectively, after laser irradiation with a power density of 2 MW/cm$^2$. As represented, images (a) and (c) of FIG. 10 show both the underlying nanowire network as well as the PET substrate was at least partially protected by the presence of the graphene shield. However, for the NW network shown in images (b) and (c) of FIG. 10, there was significant damage to the PET substrate in addition to the nanowires. This shows the potential of a single layer of graphene as a single-atomic thin barrier for reducing pulsed-laser-induced thermal damage.

In a fourth nonlimiting embodiment, a laser peen sintering (LPS) process is provided for improving TCFs by first producing a laser induced shockwave with a laser peening process in order to compress the film, and then subsequently joining nanomaterials of the compressed film with a laser sintering process. The laser peening process preferably decreases porosity and brings nanomaterials, for example nanowires, of the TCFs into contact, and the laser sintering process (i.e., pulsed laser heating) preferably fuses contacts or junctions between the nanomaterials.

Figure 11:
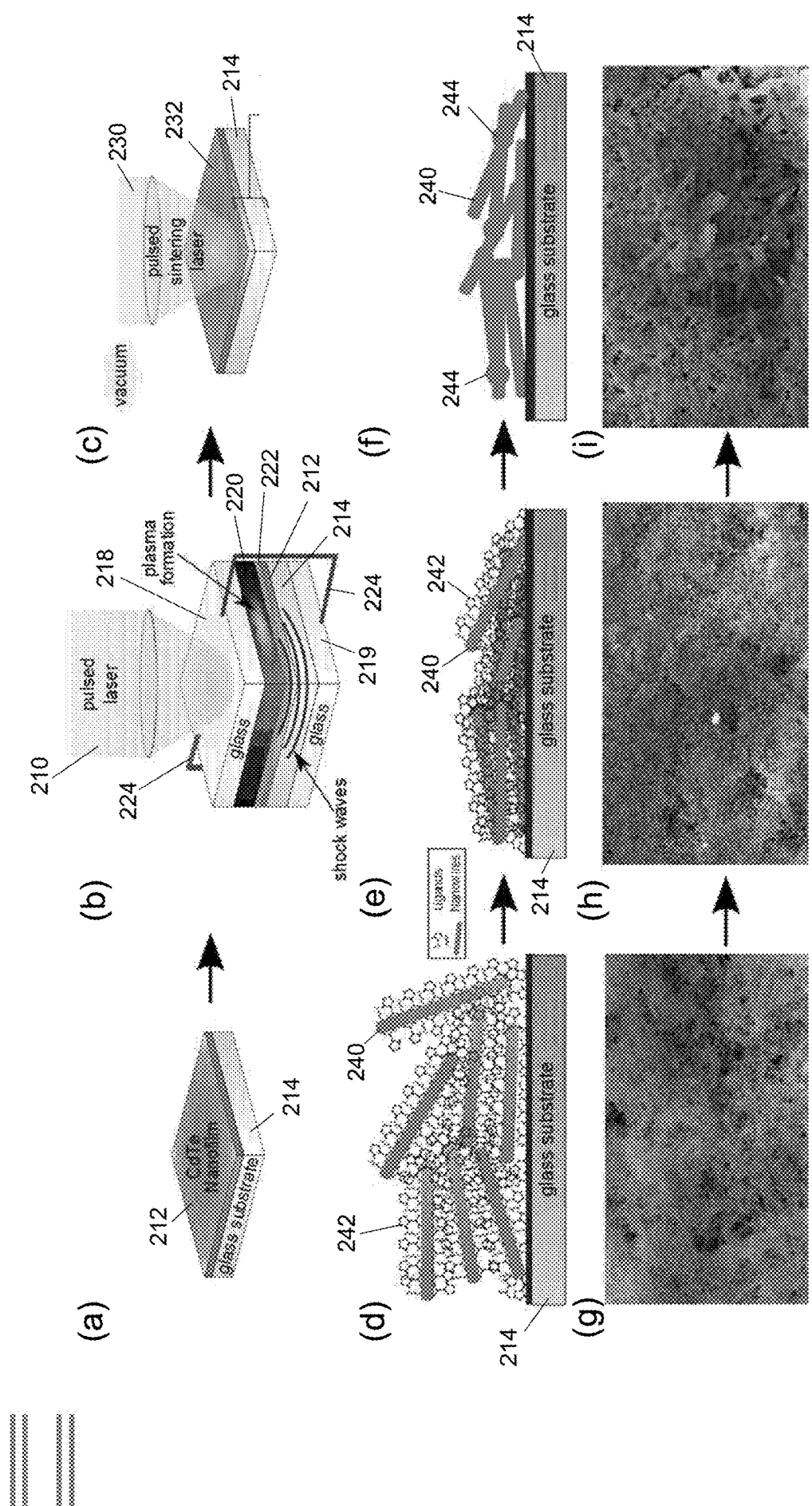
FIG. 11 includes images that schematically represent a laser peen sintering process for reducing the resistivity of a transparent conducting film (images (a) through (c)), schematically represent states of a nanowire network on the film at various stages of the peen sintering process (images (d) through (f)), and typical top-view SEM images of a CdTe nanowire film at various stages of the peen sintering process (images (g) through (i)).

Images (a) through (c) of FIG. 11 schematically represent such an LPS process. The process initially begins with a film 212 comprising a nanomaterial network on a substrate 214 (i.e., CdTe NW film on a glass substrate), as represented in image (a) of FIG. 11. The film 212 may be formed by any means in the art. In investigations leading to certain aspects of the present invention, a CdTe NW film was produced by mixing tellurium dioxide ($TeO_2$), polyvinylpyrrolidone (PVP40), ethylene glycol and potassium hydroxide (KOH) to make a tellurium precursor. After one hour of stirring and heating at 140° C., a cadmium chloride ($CdCl_2$)/ethylene glycol mix (Cd precursor) was added. The formula was mixed for another hour at 140° C. The resulting CdTe wires had diameters ranging from of 25 to 50 nm (average of about 40 nm) and were 400-900 nm in length (average of about 675 nm). The wires were precipitated and rinsed twice in a centrifuge with deionized water, then twice with 200-proof ethanol. They were deposited onto glass substrates under nitrogen via dip coating with hydrazine hydrate (80%) and acetonitrile.

During the peening process, the film 212 is preferably located between a first glass containment layer 219 and an aluminum layer 222 having a black-body absorbing layer 220 (i.e., graphite) thereon, as represented in image (b) of FIG. 11. A second glass containment layer 218 is then located on top of the absorbing layer 220 to contain it. Clamps 224 may be applied to the first and second glass containment layers 219 and 218 to secure the multiple layers 220 and 222 and the film 212. Next, a laser beam 210 is directed and pulsed at the second glass containment layer 218 (i.e., about 5 ns pulses). The laser beam 210 may irradiate the absorbing layer 220 and generate plasma. The aluminum layer 222, which remains in its solid state, pushes on the film-on-glass-substrate below. In turn, shockwaves are preferably created and impact the film 212 in pulses in order to compress the film 212 without substantially changing the temperature of the film 212. After the peening process is completed, the compacted film 232 comprising the compressed nanomaterial network and substrate 214 may be removed from the other layers 218, 220, 222, and 219 and placed in a vacuum wherein a laser sintering process is performed with a second laser 230 on the compacted film 232 to combine the compressed nanomaterial network therein, as represented in image (c) of FIG. 11.

Images (d) through (f) of FIG. 11 schematically represent states of a nanowire (NW) network on the film 212 and 232 during the process. In image (d) of FIG. 11, individual nanowires 240 of the NW network are represented as being solution-deposited on the substrate 214 prior to the peening process, wherein the nanowires 240 are wrapped with ligands 242 and unconnected. Image (e) of FIG. 11 represents the nanowires 240 as having been compressed by the peening process such that the nanowires 240 are placed in better contact with adjacent nanowires 240. Image (f) of FIG. 11 represents the NW network after sintering, wherein the sintering process has removed the ligands 242 and strongly joined the individual nanowires 240 by forming chemical bonds at junctions 244 between them, while the general morphology of the nanowires 240 has been preserved.

Images (g) through (i) of FIG. 11 are typical top-view SEM images of a CdTe NW film, including image (g) showing the film prior to peening; image (h) showing the film after 400 MPa peening has been applied thereto, and no sintering has been performed; and image (i) showing the film after 400 MPa peening has been applied and then the film has been sintered with two 25-ns pulses at 14 $mJ/cm^2$. As represented, the density of the film greatly increased and the porosity decreased as a result of the LPS process.

Figure 12:
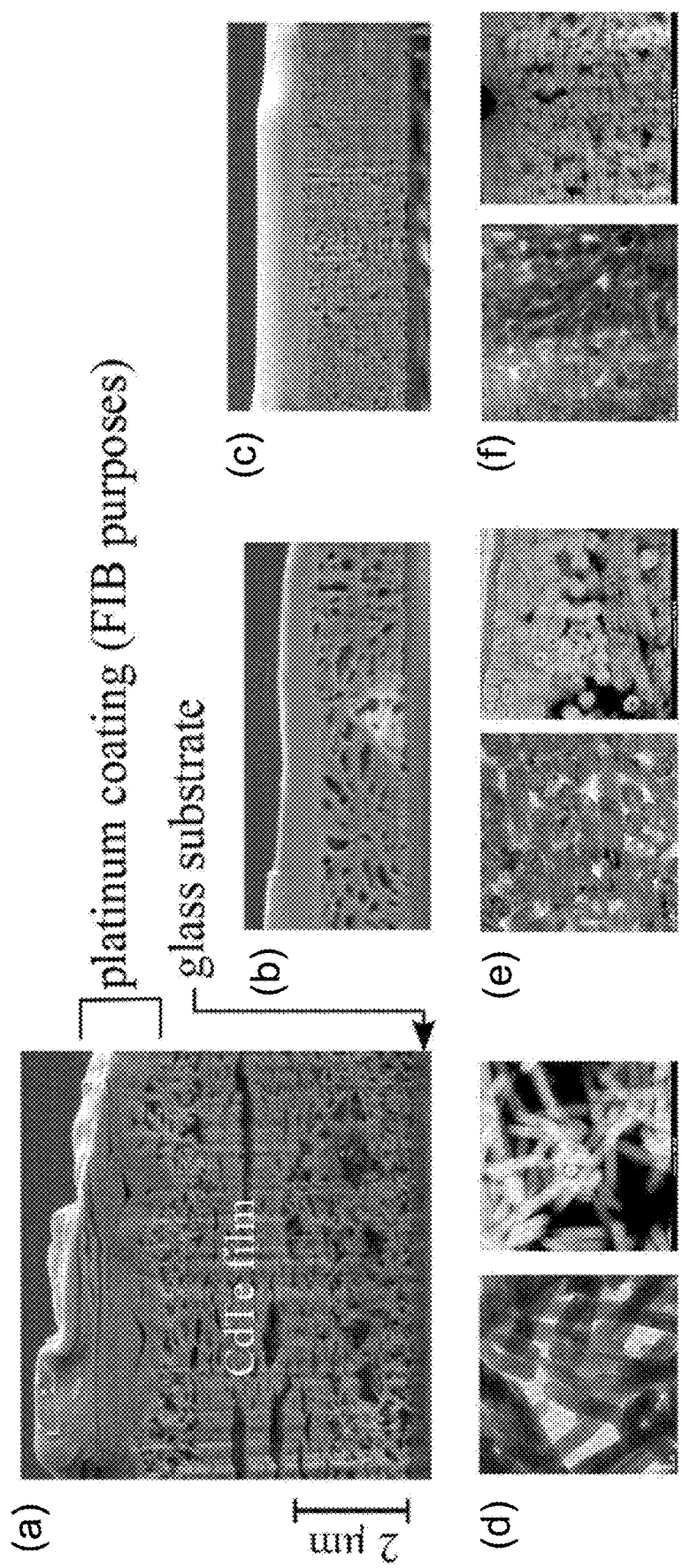
FIG. 12 includes images of a CdTe nanowire film produced by the process of FIG. 11, including typical cross-sections of the CdTe NW film extracted using a focused ion beam (FIB) technique prior to preening (image (a)), after preening (image (b)), and after sintering (image (c)), and TEM images showing nanowire connections of the film prior to preening (image (d)), after preening but before sintering (image (e)), and after sintering (image (f)).

Images (a) through (c) of FIG. 12 are typical cross-sections of the CdTe NW film extracted using the focused ion beam (FIB) technique. Image (a) shows the film prior to peening; image (b) shows the film after being compressed at 400 MPa; and image (c) shows the film after being compressed at 400 MPa and then sintered at 24 $mJ/cm^2$ with two 25 ns pulses. As represented, the film thickness and porosity dramatically decrease as a result of the LPS process. A top coating of platinum is shown in the images which was layered on the film to assist in the FIB process. Images (d) through (f) of FIG. 12 are TEM images showing nanowire connections of the film prior to peening (image (d)), after being compressed at 400 Mpa (image (e)), and after being compressed at 400 MPa and later sintered (image (f)).

On a macroscale, the nanowires were observed to cluster together and form larger, individual groups when sintered. The film "tore" as some nanocrystals melded closer to each other and broke away from others. Had the test film been very thin or sparse, this gap formation would have caused a loss in connection across the film; however, because the tested film had a high starting volume fraction, the lowest layers of CdTe appeared to be less affected by the heat, and tended to maintain the previous structure. The result was that, throughout many areas of the film, upper layers formed clusters of welded wires while lower, less-treated layers keep a connection between these high-conductivity groups.

The investigations described above indicated that solely laser peening or sintering can only moderately improve the thin-film quality; however, when coupled together as a laser peen sintering (LPS) process, the electrical conductivity enhancement is dramatic. LPS may decrease resistivity up to a factor of about 10,000, resulting in values on the order of about $10^5$ Ω-cm in some cases, which is comparable to CdTe thin-films. For instance, samples that were compressed and not later sintered exhibited an average resistivity (ρ) decrease of no larger than a factor of 10 from the untreated samples. On the other hand, samples that were sintered without compression beforehand showed a larger improvement having a decrease of a factor of about 100, but even this paled in comparison to samples that were dually treated. (One could heavily increase the sintering power to lower ρ; however, this lower ρ would result from the film melting rather than improved NW proximity and contact area fusion. It is preferred that the film is not liquefied, because the general nanowire-based film morphology would not be maintained.) The dually treated samples exhibited ρ's of up to a factor of about $10^4$ times lower than the untreated samples. The vast decrease can be attributed to two factors: (a) the lower porosity and higher density of the films, and (b) the way in which the wires are more effectively fused together once this density has increased. This allows a continuous pathway for charge while maintaining the morphology.

A technical feature of processes of the type described above are capable of producing nanowire films comprising dense, well-connected nanowire networks with resistivities up to 10,000 times lower than untreated films. This process provides films with improved electrical properties and has the potential to benefit the development of high quality, solution-synthesized and nanomaterial-based electro-optical devices.

While the invention has been described in terms of specific embodiments, it is apparent that other forms could be adopted by one skilled in the art. For example, materials and processes/methods other than those noted could be used, and the physical configuration of the systems and layers could differ from that shown. Therefore, the scope of the invention is to be limited only by the following claims.

The invention claimed is:

1. A process of producing a transparent conducting film, the process comprising:
   printing nanomaterials on a substrate so as to create points of contact between the nanomaterials; and
   directing a laser beam onto the nanomaterials, the laser beam directly welding only the nanomaterials at only the points of contact between the nanomaterials to form welded junctions between the nanomaterials without otherwise affecting the nanomaterials by melting the nanomaterials at the points of contact therebetween, only partly melting or not melting other portions of the nanomaterials, and not melting the substrate,
   wherein printing of the nanomaterials includes depositing nanomaterials embedded in a transparent conductive oxide nanoparticle matrix material,
   wherein the nanomaterials include silver or copper nanowires, the substrate is polyethylene terephthalate, and the transparent conductive oxide nanoparticle matrix material is an aluminum doped zinc oxide nanoparticle matrix material.

2. The process of claim 1, wherein the nanomaterials are nanowires and the junctions between the nanomaterials are welded nanowire junctions that join adjacent nanowires to form a welded nanowire network.

3. The process of claim 1, wherein printing of the nanomaterials includes depositing an aqueous solution comprising the nanomaterials onto the substrate and then heating the aqueous solution to dry the nanomaterials.

4. The process of claim 1, wherein the substrate is a continuous web and the nanomaterials are printed thereon with a roll-to-roll printing process.

5. The process of claim 1, wherein the nanomaterials include nanowires, and the transparent conducting film consists of the nanomaterial network and the substrate.

6. The process of claim 1, the process further comprising:
   directing a second laser beam towards the transparent conducting film such that the nanomaterials experience laser shock pressure sufficient to compress the nanomaterials; and then
   directing a third laser beam towards the transparent conducting film such that junctions between the nanomaterials are fused.

7. The process of claim 6, further comprising locating an aluminum layer, a black-body absorbing layer, and a glass confinement layer over the transparent conducting film so that the 2D material is between the substrate and each of the black-body absorbing layer and the glass confinement layer while the second laser beam is being directed towards the transparent conducting film, wherein the second laser beam is directed through the glass confinement layer to irradiate the black-body absorbing layer.

8. The process of claim 6, wherein the nanomaterials include nanowires wrapped with ligands, the third laser beam removing the ligands when directed towards the transparent conducting film.

9. The process of claim 6, wherein the nanomaterials include cadmium tellurium nanowires.

10. A process for tightly integrating nanomaterials with a two-dimensional (2D) material having one dimension that is nanoscale and other dimensions that are greater than nanoscale, the process comprising:
    locating the 2D material over the nanomaterials,
    directing a laser beam towards the 2D material such that only laser shock pressure is transferred to the 2D material to conformally wrap the 2D material on the nanomaterials; and
    wherein the process further comprising locating an aluminum layer, a black-body absorbing layer, and a glass confinement layer over the 2D material so that the 2D material is between the substrate and each of the black-body absorbing layer and the glass confinement layer while the laser beam is being directed towards the 2D material, wherein the laser beam is directed through the glass confinement layer to irradiate the black-body absorbing layer, and
    wherein the 2D material is graphene.

11. The process of claim 10, further comprising locating a layer of water between the 2D material and the laser beam prior to directing the laser beam towards the 2D material.

12. The process of claim 10, further comprising locating a layer of water, an aluminum layer, a black-body absorbing layer, and a glass confinement layer over the 2D material so that the 2D material is between the substrate and each of the black-body absorbing layer and the glass confinement layer while the laser beam is being directed towards the 2D material, wherein the laser beam is directed through the glass confinement layer to irradiate the black-body absorbing layer.

13. The process of claim 10, wherein the laser beam directly irradiates the 2D material when the laser beam is directed towards the 2D material.

* * * * *